United States Patent [19]

Camlibel et al.

[11] Patent Number: 4,502,898
[45] Date of Patent: Mar. 5, 1985

[54] DIFFUSION PROCEDURE FOR SEMICONDUCTOR COMPOUND

[75] Inventors: Irfan Camlibel, Stirling; Howard J. Guggenheim, Bridgewater; Shobha Singh, Summit; LeGrand G. Van Uitert, Morris Township, Morris County; George J. Zydzik, Columbia, all of N.J.

[73] Assignee: AT&T Bell Laboratories, Murray Hill, N.J.

[21] Appl. No.: 563,701

[22] Filed: Dec. 21, 1983

[51] Int. Cl.³ .................... H01L 21/225; H01L 21/20
[52] U.S. Cl. .................................... 148/188; 148/187; 252/950; 427/85
[58] Field of Search .................. 148/188, 187; 427/85; 252/950, 951

[56] References Cited

U.S. PATENT DOCUMENTS

| | | | |
|---|---|---|---|
| 3,907,616 | 9/1975 | Wiemer | 148/188 X |
| 3,925,121 | 12/1975 | Touchy | 148/187 X |
| 4,115,164 | 9/1978 | Jäger et al. | 148/188 X |
| 4,177,298 | 12/1979 | Shigeta et al. | 427/85 |
| 4,213,808 | 7/1980 | Thompson et al. | 148/188 |
| 4,264,381 | 4/1981 | Thompson et al. | 148/188 X |

OTHER PUBLICATIONS

"Zn-Diffused $In_{0.53}Ga_{0.47}As/InP$ Avalanche Photodetector", *Applied Physics Letters*, 35(6), Y. Matsushima, pp. 466–468, (1979).

"Low Dark Current, High Efficiency Planar $In_{0.53}Ga_{0.47}As/InP$ P-I-N Photodiodes", *IEEE Electron Device Letters*, vol. EDL-2, No. 11, S. R. Forrest, pp. 283–285, (1981).

"Planar Type Vapor-Phase Epitaxial $In_{0.53}Ga_{0.47}As$ Photodiode", *IEEE Electron Device Letters*, vol. EDL-1, No. 4, N. Susa, pp. 55–57, (1980).

*Heterostructure Lasers*, H. C. Casey, Jr. et al., Academic Press, (1978) p. 33.

"Plasma Enhanced CVD $Si_3N_4$ Film Applied to InP Avalanche Photodiodes", *Japanese Journal of Applied Physics*, vol. 19, No. 11, (1980), N. Susa et al., pp. L675–L678.

*Primary Examiner*—W. G. Saba
*Attorney, Agent, or Firm*—Walter G. Nilsen

[57] ABSTRACT

A process is described for doping compound semiconductors using a metal fluoride (e.g., $ZnF_2$) as the source of dopant. The anhydrous metal fluoride is put down on the surface of the compound semiconductor, capped with a suitable encapsulant and heat treated to promote the diffusion. The heat treatment can be carried out in air without danger of surface damage to the compound semiconductor. Also, the diffusion is better controlled as to depth of diffusion and boundary delineation.

23 Claims, 2 Drawing Figures

DIFFUSION PROCEDURE FOR SEMICONDUCTOR COMPOUND

TECHNICAL FIELD

The invention is a process for fabricating semiconductor devices. It is most specifically directed to the doping procedure for semiconductor compounds.

BACKGROUND OF THE INVENTION

Great advances have been made in semiconductor technology in the last few years due largely to greater demands for more exotic circuits, denser circuit packing, larger memories, higher frequencies and greater speeds. These demands have resulted in circuits with elements of smaller size, smaller spacing between circuit elements, more precise location of circuit features, etc. The trend toward denser packing of circuit elements continues and is likely to continue for some time.

A particular case in point is in the fabrication of various semiconductor devices containing one or more compound semiconductors including indium phosphide and related compounds such as indium gallium arsenide phosphide and indium gallium arsenide. Typical devices are photodetectors, light-emitting diodes and semiconductor lasers.

A particularly important aspect of semiconducting processing is the introduction of the dopant to the semiconductor material. Traditional techniques involve gaseous diffusion from metal vapor (e.g., Zn, Cd, etc.) in sealed ampules. Sometimes other sources are used such as phosphides (e.g., $ZnP_2$, $CdP_2$ etc.) or arsenides (e.g., $ZnAs_2$, $CdAs_2$, etc.) in appropriate cases. For many applications, this procedure yields excellent results. Conventional doping techniques have been described in a number of references including a paper entitled, "Zn-Diffused $In_{0.53}Ga_{0.47}As/InP$ Avalanche Photodetector" by Y. Matsushima et al, *Applied Physics Letters*, 35 (6) (Sept. 15, 1979) and "Low Dark Current, High Efficiency Planar $In_{0.53}Ga_{0.47}As/InP$ P-I-N Photodiodes" by S. R. Forrest, *IEEE Electron Device Letters*, Vol. EDL-2, No. 11 (November 1981). Other references include "Planar Type Vapor-Phase Epitaxial $In_{0.53}Ga_{0.47}As$ Photodiode" by N. Susa et al, *IEEE Electron Device Letters*, Vol. EDL-1, No. 4 (April 1980) and "Plasma Enhanced CVD $Si_3N_4$ Film Applied to InP Avalanche Photodiodes", by N. Susa, *Japanese Journal of Applied Physics*, Vol. 19, page L675 (1980).

SUMMARY OF THE INVENTION

The invention is a procedure for making semiconductor devices comprising III-V semiconductor compound in which the III-V semiconductor compound is doped with zinc or cadmium or both by first depositing the fluoride of these elements on the surface of the III-V semiconductor compound, covering the fluoride with an encapsulant (e.g., $Al_2O_3$, $SiO_2$, borosilicate glass, phosphosilicate glass, etc.) and then heat treating at elevated temperatures (e.g., 500 degrees C.) to diffuse the zinc or cadmium into the semiconductor. The procedure is highly advantageous because the diffusion profile can be more closely controlled than with conventional procedures and is highly reproducible. Also, the time-consuming diffusion process is carried out in air-ambient conditions and the semiconductor surface remains protected throughout the heat treatment involved in the diffusion process. The concentration of dopant (particularly on the surface) can be controlled. The photodiode devices formed by this procedure have unusually low dark currents and exceptionally good operating characteristics.

DETAILED DESCRIPTION

Figure 1:
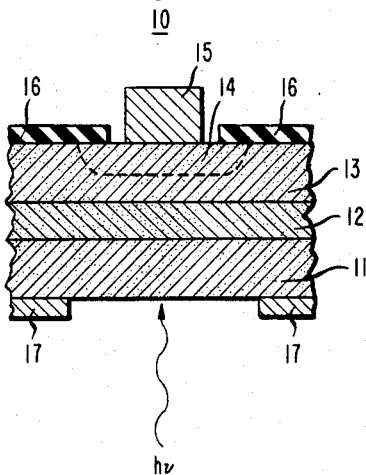
FIG. 1 shows a side view of a P-I-N planar photodiode made in accordance with the invention.

The invention is based on the discovery that certain fluorides such as zinc fluoride and cadmium fluoride can be used to dope III-V semiconductor compounds by diffusing metal from the fluorides into the semiconductor compound. Particularly important is that the fluoride be anhydrous so as to ensure proper diffusion into the semiconductor compound. Because of the requirement that the fluoride be anhydrous, a special preparation procedure is used to ensure the essential absence of water, oxyfluoride or oxide as well as other impurities.

The general procedure for carrying out the doping procedure involves deposition of the relevant fluoride on the semiconductor surface, encapsulation and then heat treatment. A typical procedure is as follows: First, the surface of the semiconductor is delineated so that fluoride appears only where diffusion is desired. Next, the surface of the semiconductor with fluoride is covered with encapsulant, heat treated and then further processed to produce a particular device. For example, the dielectric and fluoride are often removed and electrical contacts put on the areas where diffusion has occurred.

The process is applicable to a large number of devices where zinc and cadmium are suitable dopants. This includes various devices which contain III-V compound semiconductors where zinc and cadmium are used as dopants. Typical devices are photodetectors (both P-I-N planar diodes and Mesa detectors), light-emitting diodes, lasers, field effect transistors, etc.

A more detailed description of the process is given below. A particularly important element of the process is that the fluoride (e.g., $ZnF_2$, $CdF_2$) be anhydrous (typically containing less than 1.0 mole percent oxygen, oxyfluoride or water). Indeed, more often much less water or oxygen content is preferred, for example, less than 0.1 or even 0.01 mole percent. High purity in the doping fluoride is generally preferred.

A convenient way of ensuring high purity fluoride is to synthesize the fluoride from high purity materials (e.g., metal) under controlled conditions. Typical procedures for zinc fluoride and cadmium fluoride are given below.

For zinc fluoride, high purity zinc metal sponge is reacted with concentrated aqueous hydrogen fluoride (about 48 weight percent) for sufficient time to convert all the zinc into zinc fluoride. The zinc fluoride is then dried, sintered and melted in a dry hydrogen fluoride atmosphere. The material is then zone refined in an atmosphere of dry hydrogen fluoride.

The preparation procedure for cadmium fluoride is somewhat different. High purity cadmium metal (typically 99.999 percent pure) is reacted with acetic acid and hydrogen peroxide to yield cadmium acetate. This compound is then reacted with hydrogen fluoride to yield cadmium fluoride. The cadmium fluoride is slowly heated to the melting point in an atmosphere of carbon tetrafluoride to ensure removal of water, oxide and oxyfluoride.

Where the metal fluoride is already available, various procedures can be used to remove water, oxide and oxyfluoride from the metal fluoride. Generally, these procedures involve melting, fusing and/or zone refining under appropriate atmospheres such as fluorine, hydrogen fluoride or organic fluoride such as carbon tetrafluoride.

The fluoride may be deposited on the surface of the semiconductor by a variety of techniques including magnetron sputtering, E-beam (electron beam) deposition and evaporation. Introduction of water or oxygen during the deposition procedure is to be avoided. Generally, E-beam deposition is preferred because of cleanliness of the procedure and the fact that a variety of encapsulants can be deposited immediately afterwards in the same apparatus without exposing the fluoride to the atmosphere.

An understanding of the invention is facilitated by a description of E-beam technology as a procedure for depositing a material such as zinc fluoride or cadmium fluoride on a surface. This technology is discussed in a number of references including *Physical Vapor Deposition*, published by Airco Temescal (a division of Airco, Inc.) 2850 Seventh Street, Berkeley, Calif. 94710.

In this procedure, an electron beam is used to evaporate a material for condensation on a surface. The procedure is highly advantageous for a number of reasons. Improved electron guns permit high evaporation rates. It is relatively easy to keep the evaporated material free of contamination. The process can be precisely controlled and there is an excellent economy of material and a high thermal efficiency.

Generally, the electron beam evaporation process is carried out in a vacuum environment. Typically, the chamber pressure is less than about $10^{-4}$ Torr. Typical chamber pressures are in the range from $10^{-5}$ to $10^{-6}$ Torr.

Thickness of the fluoride layer may vary over large limits depending on a variety of factors including desired doping profile, temperature and duration of the heat treatment, etc. Typical limits are from about 50 to 5000 Angstroms with about 100 to 1000 Angstroms most useful. For many devices, a thickness of 150 to 350 Angstroms is most preferred.

An encapsulant is used to prevent evaporation of the fluoride during the heat treatment and to prevent surface damage to the semiconductor material during the heat treatment. Indeed, one of the major advantages of the inventive process is the superior operating characteristics of devices made in accordance with the invention. This is believed to be due to protection of the surface of the semiconductor against damage from the heat treatment necessary to diffuse in the dopant.

Various encapsulants can be used in the practice of the invention. Particularly useful are such substances as $SiO_2$, $Al_2O_3$, various glasses such as borosilicate glass, phosphosilicate glass, etc. Also useful are combinations of these substances such as $Al_2O_3$ over $SiO_2$. The thickness of the encapsulant may vary somewhat. For example, single film encapsulants typically vary from 1000 to 4000 Angstrom Units in thickness. For composite encapsulants, typical thickness for the first film is from 200 to 800 Angstrom Units and the cap film is from about 1000 to 3000 Angstrom Units.

Doping profiles can be varied in a number of ways including varying the temperature and time of the heat treatment, varying the composition and thickness of the doping compound and varying the composition and thickness of the encapsulating substance. For example, the encapsulating compound can be arranged so that part of the doping compound diffuses into the encapsulating compound and part into the III-V semiconductor compound. This procedure reduces the concentration of dopant (Zn or Cd) on the surface and generally reduces the concentration in the depth profile. For example, $ZnF_2$ covered with relatively nonporous encapsulant (e.g., $Al_2O_3$, borosilicate glass) yields surface doping levels of about $10^{18}$ zinc acceptors per cubic centimeter (this number is considerably smaller than the number of Zn atoms diffused per cubic centimeter) whereas with a more porous encapsulant such as $SiO_2$ (typically with thicknesses of 600 to 2000 Angstroms) surface doping levels are about $10^{17}$ zinc acceptors per cubic centimeters. Further reduction in the surface doping levels can be made by making the layer of fluoride unusually thin (50–150 Angstroms) and to some extent by making the thickness of porous encapsulant unusually thick.

Various III-V semiconductor compounds may be used in the practice of the invention. The two most important III-V semiconductor compounds commercially are InP and GaAs but other compounds are also of interest such as InSb, GaSb, AlSb, InAs, etc. Also of interest are the ternary and quaternary III-V semiconductor compounds particularly those that are lattice matched to these binary compounds. Typical examples are compounds such as InGaAs ($In_{0.53}Ga_{0.47}As$), AlGaPAs, GaInPAs, GaInAsSb, etc. A list of such compounds is contained in a book by H. C. Casey, Jr. and M. B. Panish entitled, *Heterostructure Lasers*, Part 13, Academic Press, New York, page 33.

The time and temperature of the heat treatment are of particular importance in the practice of the invention. These variables determine the depth profile of the doping atoms. Generally, the dependence of depth and concentration profile on time and temperature of the heat treatment is different for different fluorides (i.e., $ZnF_2$ and $CdF_2$) and semiconductor compounds.

In general, the temperature varies from about 300 to about 650 degrees C. Below 300 degrees C., diffusion is generally too slow to be of commercial interest. Above 650 degrees C., there is often substantial danger of damage to the semiconductor although for short times higher temperatures might be permitted.

Preferred temperatures often depend on the fluoride used and the semiconductor involved. Preferred temperature ranges often are a balance between short heat treatment times and the danger of causing surface damage to the semiconductor involved.

For $ZnF_2$ and InP, the preferred temperature range is from 300 to 550 degrees C. Higher temperatures are generally preferred because the diffusion times are less. Generally, the limitation on high temperature is the danger of damage to the semiconductor and control of the diffusion process. Diffusion times vary from about 1 minute to about 100 hours. The depth of diffusion increases as the square root of the diffusion time at a particular temperature as expected from the diffusion equation.

For $ZnF_2$ on InGaAs, the preferred temperature range for the heat treatment is 450 to 600 degrees C. For $CdF_2$ on InP, the preferred temperature range is 450 to 650 degrees C. and for $CdF_2$ on InGaAs, the preferred temperature range is 550 to 650 degrees C.

Diffusion depths for several diffusion times and temperatures in InP with ZnF$_2$ were measured with the following results: 15.0 μm at 550 degrees C. for 2 hours; 3.0 μm at 500 degrees C. for 0.5 hours; 1.7 μm at 400 degrees C. for 2 hours and 0.13 μm at 350 degrees C. for 72 hours. These results are consistent with an activation energy of 1.4 e.v.

For ZnF$_2$ on InGaAs (unintentionally doped n-type), the preferred temperature range is 450 to 600 degrees C. Times may vary over the same ranges as for InP. Typical results are 1.0 μm diffusion depth at a diffusion temperature of 550 degrees C. for a diffusion time of 2 hours.

For CdF$_2$ on InP (unintentionally doped n-type), a 2 hour diffusion at 550 degrees C. produced a diffusion depth of 4 μm and on epitaxially grown InGaAs (again unintentionally n-type), a 0.5 μm depth was produced in about 15 minutes at 600 degrees C.

In order to obtain a clearer understanding of the invention, a particular example will be described. In particular, a description of the fabrication of a P-I-N planar photodiode is described. A wafer of InP is first obtained. This wafer serves as the substrate for all the devices made on the wafer. Typical substrate material is doped n-type with tin or sulfur for convenience in growing. The wafer is covered with a buffer layer of n-type InP grown generally by liquid phase epitaxial growth and thereby a layer of n-type InGaAs (In$_{0.53}$Ga$_{0.47}$As) also grown by the liquid phase epitaxial method.

Prior to deposition of the films, the surface is polished mechanically with a chemical polish such as one percent bromine in methanol. Generally, this is done until a mirror-like finish is produced. The surface is then degreased in chloroform, acetone and methanol and then etched for 1 minute in a 1:1 solution of hydrofluoric acid in deionized water. The surface is then thoroughly rinsed in deionized water and blown dry with nitrogen gas. The sample was then immediately transferred to an E-beam evaporator for sequential deposition of 150 Angstroms of ZnF$_2$ and 1000 Angstroms of SiO$_2$. The surface is then patterned by conventional photolithographic techniques. For example, a protective coating is left on small islands (typically about 75 μm in diameter) and the remainder of the ZnF$_2$ and encapsulant removed by conventional means (generally CF$_4$ plasma and buffered HF etch). The entire surface is then covered with a thick layer (e.g., 1200 Angstroms) of SiO$_2$, borosilicate glass or phosphosilicate glass using E-beam evaporation.

The sample is then heat treated in an air-ambient, open tube for a prescribed time and temperature to yield a desired doping level and junction depth. Typical diffusion temperatures and times are about 550 degrees C. and 2.0 hours for In$_{0.53}$Ga$_{0.47}$As and 500 degrees C. and 0.5 hours for InP.

Upon completion of the heat treatment, the sample is quenched to room temperature by simply removing it from the furnace. The samples are then etched in concentrated HF to remove the films. The samples are then metallized and passivated by conventional means which results in a finished planar P-I-N photodiode.

FIG. 1 shows a photodiode 10 profitably made in accordance with the invention. The device is made up of several layers including a substrate layer 11 of n-type InP (generally doped with tin or sulfur), a buffer layer 12 of n-type InP (often doped with tellurium) typically grown with liquid phase epitaxial procedure and a layer of n-type indium gallium arsenide 13 with composition so that it is lattice matched to InP. The indium gallium arsenide is usually unintentionally doped n-type and is usually deposited by a liquid phase epitaxial procedure. A portion of the n-type indium gallium arsenide is doped p-type by the diffusion of zinc in accordance with the invention. A metal contact 15 (generally gold-zinc alloy) is used for electrical contact and the area surrounding the metal contact is covered with encapsulant 16, usually silicon nitride. The metal contact 17 on the opposite surface is usually gold-tin alloy.

A similar procedure may be used to make planar P-I-N photodiodes where cadmium is the dopant. Cadmium fluoride is used as the dopant fluoride and the heat treatment is usually at a higher temperature (typically 550 degrees C. for InP and 600 degrees C. for InGaAs). Because of the higher temperature required for cadmium diffusion, it is likely to be more stable thermally than the zinc dopant.

Figure 2:
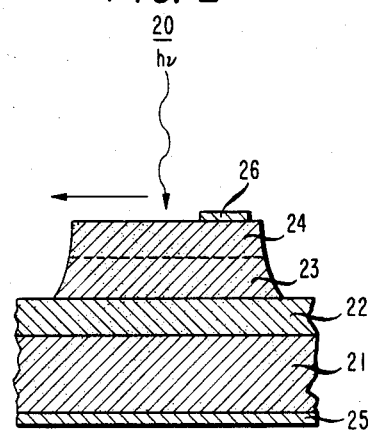
FIG. 2 shows a Mesa type avalanche photodiode.

Mesa type devices were also made by a procedure similar to that described above, at least as far as the doping procedure is concerned. A typical Mesa photodiode 20 is shown in FIG. 2. The Mesa structure is made up of a substrate 21 of tin doped InP with a buffer layer 22 of tellurium doped indium phosphide grown by a liquid phase epitaxial procedure. On top of this layer is an epitaxial layer of indium gallium arsenide grown n-type originally and then partially doped p-type with zinc in accordance with the invention. This leaves two layers, one n-type 23 and one p-type 24. A bottom electrical contact is made of gold-tin alloy and a top contact 26 is made of gold-zinc alloy.

A variety of photodiodes made in accordance with the invention were tested for dark current and capacitance as a function of voltage. At room temperature, the planar diodes typically exhibit a dark current ranging from about $3 \times 10^{-11}$ to about $10^{-8}$ amperes at $-10$ volts with very sharp breakdown voltages varying from 70 volts to 150 volts. These measurements were repeated after a 30 second etch in 0.05 weight percent bromine in methanol solution. The dark currents and breakdown voltages were slightly improved, yielding a range from $5 \times 10^{-12}$ to $10^{-8}$ amperes for the dark current and 100 to 200 volts for breakdown voltage. Capacitance was also very low, often less than the lowest capacitance measurable with the experimental apparatus (0.1 pF at 0 volts). Mesa type devices exhibited comparable electrical characteristics.

What is claimed is:

1. A process for fabricating a device comprising III-V semiconducting compounds in which at least part of the III-V semiconductor compound is doped with at least one dopant substance selected from the group consisting of zinc and cadmium characterized in that the doping procedure is carried out by heat treating the III-V semiconductor compound with the inorganic fluoride of the doping substance in contact with the III-V semiconductor compound at a sufficient temperature and for sufficient time to affect doping of the III-V semiconductor compound.

2. The process of claim 1 in which the inorganic fluoride is selected from the group consisting of zinc fluoride and cadmium fluoride.

3. The process of claim 2 in which the inorganic fluoride is anhydrous.

4. The process of claim 1 in which the inorganic fluoride is covered with an encapsulant prior to heat treating.

5. The process of claim 4 in which the encapsulant comprises at least one substance selected from the group consisting of $Al_2O_3$, $SiO_2$, phosphosilicate glass, and borosilicate glass.

6. The process of claim 1 in which the dopant substance is deposited by magnetron sputtering, E-beam deposition or evaporation.

7. The process of claim 6 in which the dopant substance is deposited by E-beam deposition.

8. The process of claim 7 in which the dopant substance and an encapsulant are deposited by E-beam deposition.

9. The process of claim 1 in which the heat treatment is carried out in the temperature range from 300 to 650 degrees C.

10. The process of claim 1 in which the time duration of the heat treatment varies from 1 minute to 100 hours.

11. The process of claim 8 in which the dopant substance is zinc fluoride.

12. The process of claim 11 in which the zinc fluoride has been heated in an atmosphere comprising fluoride-containing substance prior to deposition on the III-V semiconductor compound.

13. The process of claim 12 in which the fluoride-containing substance is hydrogen fluoride.

14. The process of claim 1 in which the III-V semiconductor compound is selected from the group consisting of InP, GaAs, InSb, GaSb, AlSb, InAs, InGaAs, AlGaPAs, GaInPAs and GaInAsSb.

15. The process of claim 14 in which the semiconductor compound is InP and the dopant substance is $ZnF_2$.

16. The process of claim 15 in which the heat treatment is carried out at a temperature between 300 and 550 degrees C. for 30 minutes to 72 hours.

17. The process of claim 14 in which the III-V semiconductor compound is InGaAs and the dopant substance is $ZnF_2$.

18. The process of claim 17 in which the temperature of the heat treatment is from 450 to 600 degrees C. for times between 30 minutes and 72 hours.

19. The process of claim 14 in which the III-V semiconductor compound is GaAs and the doped substance is $ZnF_2$.

20. The process of claim 14 in which the III-V semiconductor compound is selected from the group consisting of InP, GaAs, and InGaAs and the dopant substance is $CdF_2$.

21. The process of claim 20 in which the III-V semiconducting compound is InP, the dopant substance is $CdF_2$ and the temperature range of the heat treatment is between 450 and 650 degrees C.

22. The process of claim 20 in which the III-V semiconductor compound is InGaAs, the dopant substance is $CdF_2$ and the temperature range of the heat treatment is between 550 and 650 degrees C.

23. The process of claim 1 in which the device is selected from the group consisting of P-I-N planar photodiode, Mesa photodiode, light-emitting diode and semiconductor laser.

* * * * *